(12) United States Patent
Ma et al.

(10) Patent No.: US 11,069,789 B2
(45) Date of Patent: Jul. 20, 2021

(54) VARIED SILICON RICHNESS SILICON NITRIDE FORMATION

(71) Applicant: MONTEREY RESEARCH, LLC, Santa Clara, CA (US)

(72) Inventors: Yi Ma, Santa Clara, CA (US); Shenqing Fang, Sunnyvale, CA (US); Robert Ogle, San Jose, CA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

(21) Appl. No.: 16/865,980

(22) Filed: May 4, 2020

(65) Prior Publication Data

US 2020/0365709 A1 Nov. 19, 2020

Related U.S. Application Data

(60) Continuation of application No. 15/690,494, filed on Aug. 30, 2017, now Pat. No. 10,644,126, which is a continuation-in-part of application No. 14/665,311, filed on Mar. 23, 2015, now abandoned, which is a division of application No. 12/556,199, filed on Sep. 9, 2009, now Pat. No. 9,012,333.

(51) Int. Cl.
| | |
|---|---|
| *H01L 29/51* | (2006.01) |
| *H01L 21/28* | (2006.01) |
| *H01L 21/02* | (2006.01) |
| *H01L 29/423* | (2006.01) |
| *H01L 21/3205* | (2006.01) |
| *H01L 21/321* | (2006.01) |
| *H01L 29/792* | (2006.01) |

(52) U.S. Cl.
CPC .......... *H01L 29/518* (2013.01); *H01L 21/022* (2013.01); *H01L 21/0217* (2013.01); *H01L 21/0228* (2013.01); *H01L 21/3211* (2013.01); *H01L 21/32055* (2013.01); *H01L 29/40117* (2019.08); *H01L 29/4234* (2013.01); *H01L 29/511* (2013.01); *H01L 29/792* (2013.01)

(58) Field of Classification Search
CPC . H01L 29/518; H01L 29/511; H01L 29/4234; H01L 21/0228; H01L 29/40117; H01L 21/3211; H01L 21/022; H01L 21/0217; H01L 29/792; H01L 21/32055
USPC .......................................................... 438/791
See application file for complete search history.

(56) References Cited

U.S. PATENT DOCUMENTS

| | | | | |
|---|---|---|---|---|
| 4,855,804 A | * | 8/1989 | Bergami | ............. H01L 21/3145 257/622 |
| 6,713,873 B1 | * | 3/2004 | O'Loughlin | ........ H01L 21/3141 257/758 |
| 6,927,145 B1 | * | 8/2005 | Yang | ..................... H01L 27/115 257/E21.679 |
| 7,741,188 B2 | | 6/2010 | Dyer et al. | |
| 2004/0099928 A1 | * | 5/2004 | Nunan | ................ B81C 1/00698 257/640 |
| 2005/0263827 A1 | | 12/2005 | Shiba et al. | |
| 2006/0183305 A1 | | 8/2006 | Gao et al. | |
| 2006/0189014 A1 | | 8/2006 | Li et al. | |

(Continued)

*Primary Examiner* — Duy T Nguyen

(57) ABSTRACT

A method to fabricate a non-planar memory device including forming a multi-layer silicon nitride structure substantially perpendicular to a top surface of the substrate. There may be multiple non-stoichiometric silicon nitride layers, each including a different or same silicon richness value from one another.

1 Claim, 13 Drawing Sheets

(56) References Cited

U.S. PATENT DOCUMENTS

| | | |
|---|---|---|
| 2006/0261401 A1 | 11/2006 | Bhattacharyya |
| 2007/0128858 A1 | 6/2007 | Suvi Hauka et al. |
| 2007/0166949 A1 | 7/2007 | Chun |
| 2008/0026553 A1 | 1/2008 | Chua et al. |
| 2008/0073724 A1 | 3/2008 | Liang et al. |
| 2008/0093661 A1 | 4/2008 | Joo et al. |
| 2009/0152617 A1* | 6/2009 | Ma ............... H01L 29/42348 257/324 |
| 2013/0334650 A1 | 12/2013 | Liu et al. |
| 2015/0194499 A1 | 7/2015 | Ma et al. |

* cited by examiner

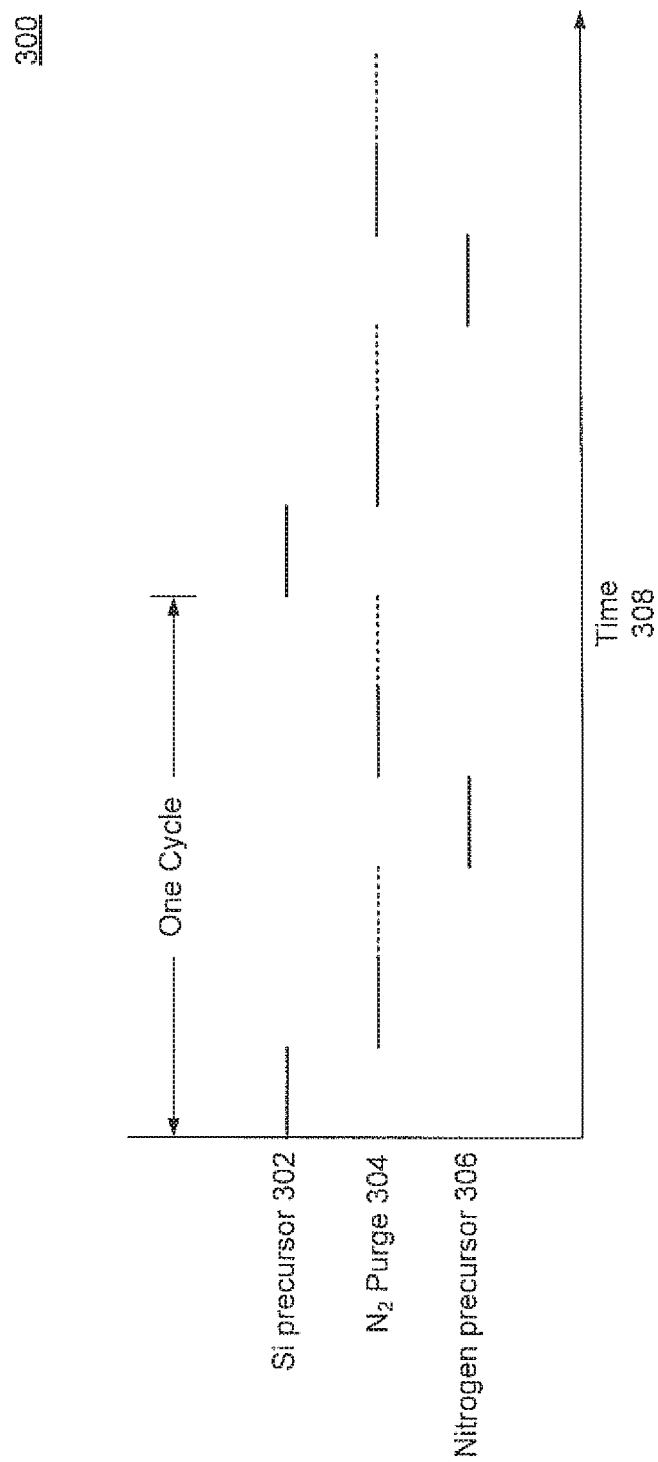

VARIED SILICON RICHNESS SILICON NITRIDE FORMATION

PRIORITY

This application is a continuation application of U.S. patent application Ser. No. 15/690,494, filed on Aug. 30, 2017, which is a continuation-in-part application of U.S. patent application Ser. No. 14/665,311, filed on Mar. 23, 2015, which is a divisional application of U.S. patent application Ser. No. 12/556,199, filed Sep. 9, 2009, now issued U.S. patent Ser. No. 9,012,333, all of which are which are both hereby incorporated herein by reference in their entirety.

BACKGROUND

Conventional computing devices typically include integrated circuit (IC) memory devices. For example, a computing device may be implemented to include volatile IC memory devices, or non-volatile IC memory devices, or both. It is pointed out that one conventional technique utilized for fabricating IC memory devices is the low pressure chemical vapor deposition (LPCVD) technique. However, when the LPCVD technique is utilized to deposit certain materials as part of fabricating IC memory devices, it may exhibit one or more shortcomings.

SUMMARY

A method, in one embodiment, can include forming a tunnel oxide layer on a substrate. In addition, the method can include depositing via atomic layer deposition a first layer of silicon nitride over the tunnel oxide layer. Note that the first layer of silicon nitride includes a first silicon richness. The method can also include depositing via atomic layer deposition a second layer of silicon nitride over the first layer of silicon nitride. The second layer of silicon nitride includes a second silicon richness that is different than the first silicon richness.

In another embodiment, an integrated circuit memory device can include a substrate and a tunnel oxide layer that is disposed over the substrate. Additionally, a first layer of silicon nitride is disposed over the tunnel oxide layer via atomic layer deposition. The first layer of silicon nitride includes a first silicon richness. A second layer of silicon nitride is disposed over the first layer of silicon nitride via atomic layer deposition. The second layer of silicon nitride includes a second silicon richness that is different than the first silicon richness.

While particular embodiments in accordance with the invention have been specifically described within this Summary, it is noted that the invention and the claimed subject matter are not limited in any way by these embodiments.

BRIEF DESCRIPTION OF THE DRAWINGS

Embodiments of the invention are illustrated by way of example and not by way of limitation in the accompanying drawings and in which like reference numerals refer to similar elements.

FIG. 3 is a chart illustrating an atomic layer deposition (ALD) process in accordance with an embodiment of the invention.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
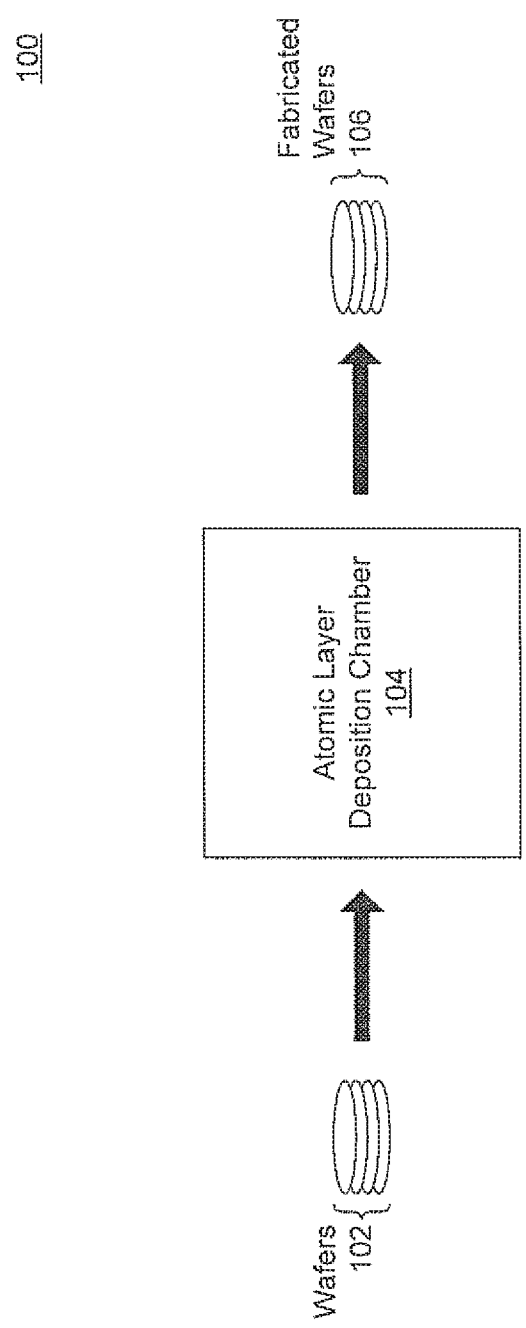
FIG. 1 is an atomic layer deposition (ALD) system which can be utilized in accordance with various embodiments of the invention.

FIG. 1 is an atomic layer deposition (ALD) system 100 which can be utilized in accordance with various embodiments of the invention. The atomic layer deposition system 100 can include an atomic layer deposition chamber 104 that can be utilized to fabricate a wide variety of integrated circuits (IC) onto one or more semiconductor substrates 102 (e.g., semiconductor wafers). For example, in one embodiment, the atomic layer deposition chamber 104 can be utilized to fabricate non-volatile memory devices, which can include flash memory. NOR-type flash memory, NAND-type flash memory, read-only memory (ROM), Electrically Erasable Programmable Read-Only Memory (EEPROM), and the like. In an embodiment, as part of fabricating or forming integrated circuit (e.g., non-volatile memory devices) onto the one or more semiconductor substrates 102, the atomic layer deposition chamber 104 can be utilized to deposit or form thereon one or more varied silicon richness silicon nitride films or layers.

Specifically, in one embodiment, one or more semiconductor wafers 102 can be put into the atomic layer deposition chamber 104 in order to fabricate integrated circuits thereon. It is noted that the one or more semiconductor wafers 102 can be implemented in a wide variety of ways. For example, the one or more semiconductor wafers 102 can be implemented with any semiconductor material, such as but not limited to, silicon crystal. In one embodiment, in order to form one or more varied silicon richness silicon nitride films onto one or more substrates such as semiconductor wafers 102, the atomic layer deposition chamber 104 can be equipped with, but is not limited to, a silane ($SiH_4$) precursor, an ammonia ($NH_3$) precursor, and a silicon precursor that are reactive within the temperature range of approximately 400-900 degrees Celsius (C). In addition, the atomic layer deposition chamber 104 can be further equipped with, but is not limited to, argon (Ar), molecular nitrogen ($N_2$), and a nitrogen precursor. Furthermore, it is pointed out that the atomic layer deposition chamber 104 can be equipped in an embodiment such that the gas flow of each precursor and gas can be independently switched on and off in a matter of seconds, but is not limited to such. After the fabrication process of integrated circuits in accordance with one or more embodiments of the invention, the one or more fabricated wafers 106 that include integrated circuits can be removed from the atomic layer deposition chamber 104. It is pointed out that the fabrication operations of the integrated circuits onto the one or more semiconductor wafers 102 can be completed in-situ.

Figure 2A:
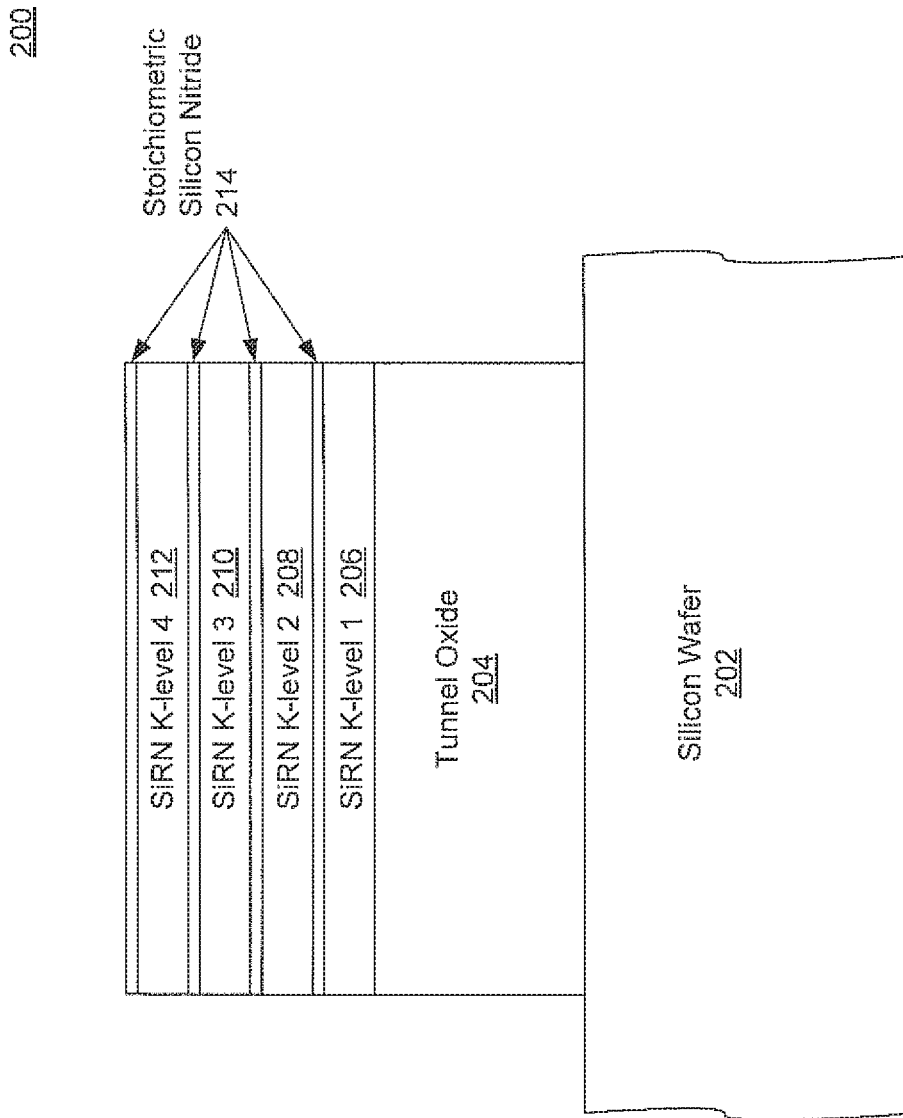
FIG. 2A is a side sectional view of an integrated circuit (IC) memory device in accordance with an embodiment of the invention.

FIG. 2A illustrates a side sectional view of an integrated circuit (IC) memory device 200 in accordance with an embodiment of the invention. It is noted that the integrated circuit memory device 200 can be fabricated utilizing the atomic layer deposition chamber 104 (FIG. 1). For example, in one embodiment, a semiconductor substrate (e.g., silicon wafer) 202 can be loaded or placed into the atomic layer deposition chamber 104 in order to fabricate integrated circuits (e.g., non-volatile memory devices) that include one or more varied silicon richness silicon nitride films or layers. In an embodiment, a thin tunnel oxide layer 204 can be formed onto (or over or above) the silicon wafer 202. After that, the atomic layer deposition chamber 104 can deposit onto (or over or above) the tunnel oxide layer 204a silicon nitride film or layer 206 having a desired silicon richness. It is pointed out that the silicon nitride film 206 can be deposited via atomic layer deposition with any type of silicon richness. For example, in one embodiment, the silicon nitride film or layer 206 can be deposited having a silicon richness ranging from one extreme of almost 100% silicon with the remaining percentage being nitride to the other extreme of almost 100% nitride with the remaining percentage being silicon, and anywhere in between. Furthermore, in an embodiment, the silicon nitride film or layer 206 can be deposited having a silicon richness of k~1.6 (wherein k is the extinction coefficient at a wavelength of 248 nanometers (nm)), but is not limited to such. In addition, note that the silicon nitride film 206 can be deposited to include an upper layer or film of stoichiometric silicon nitride 214, but is not limited to such. Furthermore, the silicon nitride film 206 can be deposited at any thickness. For example, in an embodiment, the silicon nitride film 206 can be deposited to have a thickness of approximately 2-10 angstroms (or approximately 0.2-1 nm), but is not limited to such.

Next, in one embodiment, the atomic layer deposition chamber 104 can deposit onto (or over or above) the silicon nitride film 206 a silicon nitride film or layer 208 having a different silicon richness than the silicon nitride film 206. It is pointed out that the silicon nitride film 208 can be deposited via atomic layer deposition with any type of silicon richness that is greater than or less than the silicon richness of the previous silicon nitride layer 206. For example, in an embodiment, the silicon nitride film or layer 208 can be deposited having a silicon richness of k~1.4 or ~1.7, but is not limited to such. Additionally, the silicon nitride film 208 can be deposited to include an upper layer or film of stoichiometric silicon nitride 214, but is not limited to such. Moreover, the silicon nitride film 208 can be deposited at any thickness. For example, in an embodiment, the silicon nitride film 208 can be deposited to a thickness of approximately 2-10 angstroms (or approximately 0.2-1 nm), but is not limited to such.

Referring still to FIGS. 1 and 2A, in an embodiment, the atomic layer deposition chamber 104 can deposit onto (or over or above) the silicon nitride film 208 a silicon nitride film or layer 210 having a different silicon richness than the silicon nitride film 208. Note that the silicon nitride film 210 can be deposited via atomic layer deposition with any type of silicon richness that is greater than or less than the silicon richness of the previous silicon nitride layer 208. For example, in one embodiment, the silicon nitride film or layer 210 can be deposited having a silicon richness of k~1.2 or ~1.6, but is not limited to such. Furthermore, the silicon nitride film 210 can be deposited to include an upper layer or film of stoichiometric silicon nitride 214, but is not limited to such. In addition, the silicon nitride film 210 can be deposited at any thickness. For example, in an embodiment, the silicon nitride film 210 can be deposited to a thickness of approximately 2-10 angstroms (or approximately 0.2-1 nm), but is not limited to such.

Next, in one embodiment, the atomic layer deposition chamber 104 can deposit onto (or over or above) the silicon nitride film 210 a silicon nitride film or layer 212 having a different silicon richness than the silicon nitride film 210. Note that the silicon nitride film 212 can be deposited via atomic layer deposition with any type of silicon richness that is greater than or less than the silicon richness of the previous silicon nitride layer 210. For example, in one embodiment, the silicon nitride film or layer 212 can be deposited having a silicon richness of k~1 or ~1.8, but is not limited to such. Additionally, the silicon nitride film 212 can be deposited to include an upper layer or film of stoichiometric silicon nitride 214, but is not limited to such. Moreover, the silicon nitride film 212 can be deposited at any thickness. For example, in an embodiment, the silicon nitride film 212 can be deposited to a thickness of approximately 2-10 angstroms (or approximately 0.2-1 nm), but is not limited to such. In this manner, the integrated circuit memory device 200 can be fabricated utilizing the atomic layer deposition chamber 104 to include varied or variable silicon richness silicon nitride films or layers 206, 208, 210, and 212. It is pointed out that in various embodiments, the integrated circuit memory device 200 can be fabricated in a manner similar to that described with reference to FIGS. 1 and 2A to include a greater or lesser number of varied or variable silicon richness silicon nitride films or layers than the four that are shown.

Referring to FIGS. 1 and 2A, it is pointed out that the above described fabrication processes in accordance with embodiments of the invention can provide potential benefits. For example, in one embodiment, the atomic layer deposition chamber 104 together with the above described fabrication processes can precisely engineer or control the silicon richness variation and thickness of each silicon nitride layer (e.g., 206, 208.210, or 212) to meet desired device performance. In addition, the atomic layer deposition chamber 104 together with the above described fabrication processes can have the capability to achieve extremely higher silicon richness within each silicon nitride layer (e.g., 206, 208, 210, or 212) than the conventional LPCVD (Low Pressure Chemical Vapor Deposition) technique. Furthermore, the atomic layer deposition chamber 104 together with the above described fabrication processes can produce each silicon nitride layer (e.g., 206, 208, 210, or 212) having smoother film surface roughness than those formed with the conventional LPCVD technique. Moreover, the above described fabrication processes can enable enhanced program and erase speed in non-volatile memory (e.g., multi-level cell devices). Additionally, the above described fabrication processes can enable enhanced non-volatile memory device endurance characteristics. In addition, the above described fabrication processes can change erase characteristics of non-volatile memory devices, programming characteristics of non-volatile memory devices, and data retention characteristics of non-volatile memory devices. It is pointed out that the above described fabrication processes are not limited in any way by these potential benefits.

Figure 2B:
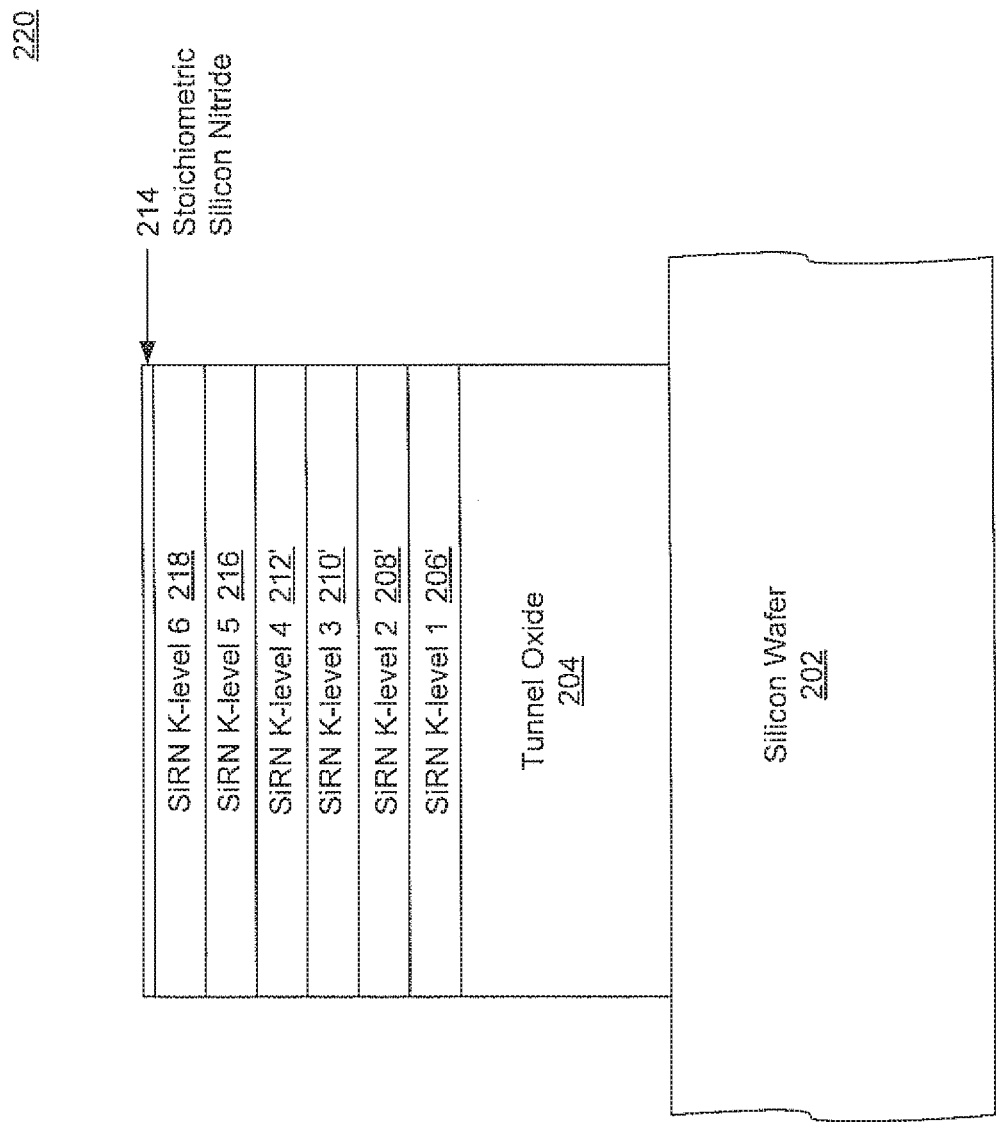
FIG. 2B is a side sectional view of an integrated circuit (IC) memory device in accordance with one embodiments of the invention.

FIG. 2B illustrates a side sectional view of an integrated circuit (IC) memory device 220 in accordance with one embodiment of the invention. Note that the integrated circuit memory device 220 can be fabricated utilizing the atomic layer deposition chamber 104 (FIG. 1). For example, in one embodiment, a semiconductor substrate (e.g., silicon wafer) 202 can be placed or loaded into the atomic layer deposition chamber 104 in order to fabricate integrated circuits (e.g., non-volatile memory devices) that include one or more varied silicon richness silicon nitride films or layers. In one embodiment, a thin tunnel oxide layer 204 can be formed onto (or over or above) the silicon wafer 202. Next, the atomic layer deposition chamber 104 can deposit onto (or over or above) the tunnel oxide layer 204 a silicon nitride film or layer 206' having a desired silicon richness. It is noted that the silicon nitride film 206' can be deposited via atomic layer deposition with any type of silicon richness. For example, in one embodiment, the silicon nitride film or layer 206' can be deposited having a silicon richness ranging from one extreme of almost 100% silicon with the remaining percentage being nitride to the other extreme of almost 100% nitride with the remaining percentage being silicon, and anywhere in between. Additionally, in one embodiment, the silicon nitride film or layer 206' can be deposited having a silicon richness of k~1.6 (wherein k is the extinction coefficient at a wavelength of 248 nanometers (nm)), but is not limited to such. In addition, note that the silicon nitride film 206' can be deposited at any thickness. For example, in one embodiment, the silicon nitride film 206' can be deposited to have a thickness of approximately 2-10 angstroms (or approximately 0.2-1 nm), but is not limited to such.

Next, in an embodiment, the atomic layer deposition chamber 104 can deposit onto (or over or above) the silicon nitride film 206'a silicon nitride film or layer 208' having a different silicon richness than the silicon nitride film 206'. Note that the silicon nitride film 208' can be deposited via atomic layer deposition with any type of silicon richness that is greater than or less than the silicon richness of the previous silicon nitride layer 206'. For example, in one embodiment, the silicon nitride film or layer 208' can be deposited having a silicon richness of k~1.4 or ~1.8, but is not limited to such. Furthermore, the silicon nitride film 208' can be deposited at any thickness. For example, in an embodiment, the silicon nitride film 208' can be deposited to a thickness of approximately 2-10 angstroms (or approximately 0.2-1 nm), but is not limited to such.

Referring still to FIGS. 1 and 2B, in one embodiment, the atomic layer deposition chamber 104 can deposit onto (or over or above) the silicon nitride film 208' a silicon nitride film or layer 210' having a different silicon richness than the silicon nitride film 208'. The silicon nitride film 210' can be deposited via atomic layer deposition with any type of silicon richness that is greater than or less than the silicon richness of the previous silicon nitride layer 208'. For example, in an embodiment, the silicon nitride film or layer 210' can be deposited having a silicon richness of k~1.2 or ~1.9, but is not limited to such. In addition, the silicon nitride film 210' can be deposited at any thickness. For example, in an embodiment, the silicon nitride film 210' can be deposited to a thickness of approximately 2-10 angstroms (or approximately 0.2-1 nm), but is not limited to such.

Next, in one embodiment, the atomic layer deposition chamber 104 can deposit onto (or over or above) the silicon nitride film 210' a silicon nitride film or layer 212' having a different silicon richness than the silicon nitride film 210'. It is noted that the silicon nitride film 212' can be deposited via atomic layer deposition with any type of silicon richness that is greater than or less than the silicon richness of the previous silicon nitride layer 210'. For example, in an embodiment, the silicon nitride film or layer 212' can be deposited having a silicon richness of k~1 or ~1.3, but is not limited to such. In addition, the silicon nitride film 212' can be deposited at any thickness. For example, in one embodiment, the silicon nitride film 212' can be deposited to a thickness of approximately 2-10 angstroms (or approximately 0.2-1 nm), but is not limited to such.

Referring still to FIGS. 1 and 2B, in an embodiment, the atomic layer deposition chamber 104 can deposit onto (or over or above) the silicon nitride film 212' a silicon nitride film or layer 216 having a different silicon richness than the silicon nitride film 212'. The silicon nitride film 216 can be deposited via atomic layer deposition with any type of silicon richness that is greater than or less than the silicon richness of the previous silicon nitride layer 212'. For example, in one embodiment, the silicon nitride film or layer 216 can be deposited having a silicon richness of k~0.9 or ~1.5, but is not limited to such. Additionally, the silicon nitride film 216 can be deposited at any thickness. For example, in an embodiment, the silicon nitride film 216 can be deposited to a thickness of approximately 2-10 angstroms (or approximately 0.2-1 nm), but is not limited to such.

Next, in an embodiment, the atomic layer deposition chamber 104 can deposit onto (or over or above) the silicon nitride film 216 a silicon nitride film or layer 218 having a different silicon richness than the silicon nitride film 216. It is noted that the silicon nitride film 218 can be deposited via atomic layer deposition with any type of silicon richness that is greater than or less than the silicon richness of the previous silicon nitride layer 216. For example, in one embodiment, the silicon nitride film or layer 218 can be deposited having a silicon richness of k~0.8 or ~1.2, but is not limited to such. Furthermore, the silicon nitride film 218 can be deposited to include an upper layer or film of stoichiometric silicon nitride 214. Moreover, the silicon nitride film 218 can be deposited at any thickness. For example, in an embodiment, the silicon nitride film 218 can be deposited to a thickness of approximately 2-10 angstroms (or approximately 0.2-1 nm), but is not limited to such. In this manner, integrated circuit memory device 220 can be fabricated utilizing the atomic layer deposition chamber 104 to include varied or variable silicon richness silicon nitride films or layers 206', 208', 210'. 212', 216, and 218. It is pointed out that in various embodiments, the integrated circuit memory device 220 can be fabricated in a manner similar to that described with reference to FIGS. 1 and 2B to include a greater or lesser number of varied or variable silicon richness silicon nitride films or layers than the six that are shown. For example, in one embodiment, one or more additional layers could have been fabricated between, but are not limited to, the silicon nitride layer 218 and the upper layer or film of stoichiometric silicon nitride 214.

Referring to FIGS. 1 and 2B, it is pointed out that the above described fabrication processes in accordance with embodiments of the invention can provide potential benefits. For example, in one embodiment, the atomic layer deposition chamber 104 together with the above described fabrication processes described with reference to FIGS. 1 and 2B can produce potential benefits similar to those described above with reference to FIGS. 1 and 2A, but are not limited to such. It is noted that the above described fabrication processes described with reference to FIGS. 1 and 2B are not limited in any way by those potential benefits.

FIG. 3 is a chart 300 illustrating an atomic layer deposition (ALD) process in accordance with an embodiment of the invention. Specifically, the chart 300 illustrates one embodiment of an atomic layer deposition process for depositing one or more varied or variable silicon richness silicon nitride layers (e.g., 206, 206', 208, 208', 210, 210', and 212) onto one or more semiconductor substrates (e.g., 102). It is noted that the graph 300 illustrates that a single cycle for the atomic layer deposition process can include four separate operations that involve using a silicon (Si) precursor 302, a molecular nitrogen ($N_2$) purge 304, and a nitrogen precursor 306. Note that in one embodiment, the silicon precursor 302 can be reactive at a temperature range of approximately 400-900 degrees Celsius, but are not limited to such. It is pointed out that the X-axis of the chart 300 represents the progression of time 308, but does not include any type of scale.

More specifically, in one embodiment, after a semiconductor substrate (e.g., 102) has been put or loaded into an atomic layer deposition chamber (e.g., 104) and a tunnel oxide layer (e.g., 204) has been formed thereon, the chart 300 indicates that the first operation can include injecting the silicon precursor 302 into the chamber for approximately a sixth of the cycle in order to deposit it onto the tunnel oxide layer. Next, the chart 300 indicates that the second operation can include the atomic layer deposition chamber (e.g., 104) performing a molecular nitrogen purge 304 of the chamber for approximately a third of the cycle in order to remove anything remaining from the previous injection of the silicon precursor 302. After that, the chart 300 indicates that the third operation can include injecting the nitrogen precursor 306 into the atomic deposition chamber for approximately a sixth of the cycle in order to deposit it onto the previously deposited silicon precursor 302 and the tunnel oxide layer. Next, the chart 300 indicates that the fourth operation can include the atomic layer deposition chamber (e.g., 104) performing the molecular nitrogen purge 304 of the chamber for approximately a third of the cycle in order to remove anything remaining from the previous injection of the nitrogen precursor 306. It is pointed out that the above described cycle of four operations can be continually repeated in order to deposit a layer of silicon nitride to a desirable thickness that has a desired silicon richness. As such, the chart 300 illustrates one embodiment of an atomic layer deposition process that can be utilized for depositing one or more varied or variable silicon richness silicon nitride layers onto one or more semiconductor wafers.

Figure 4:
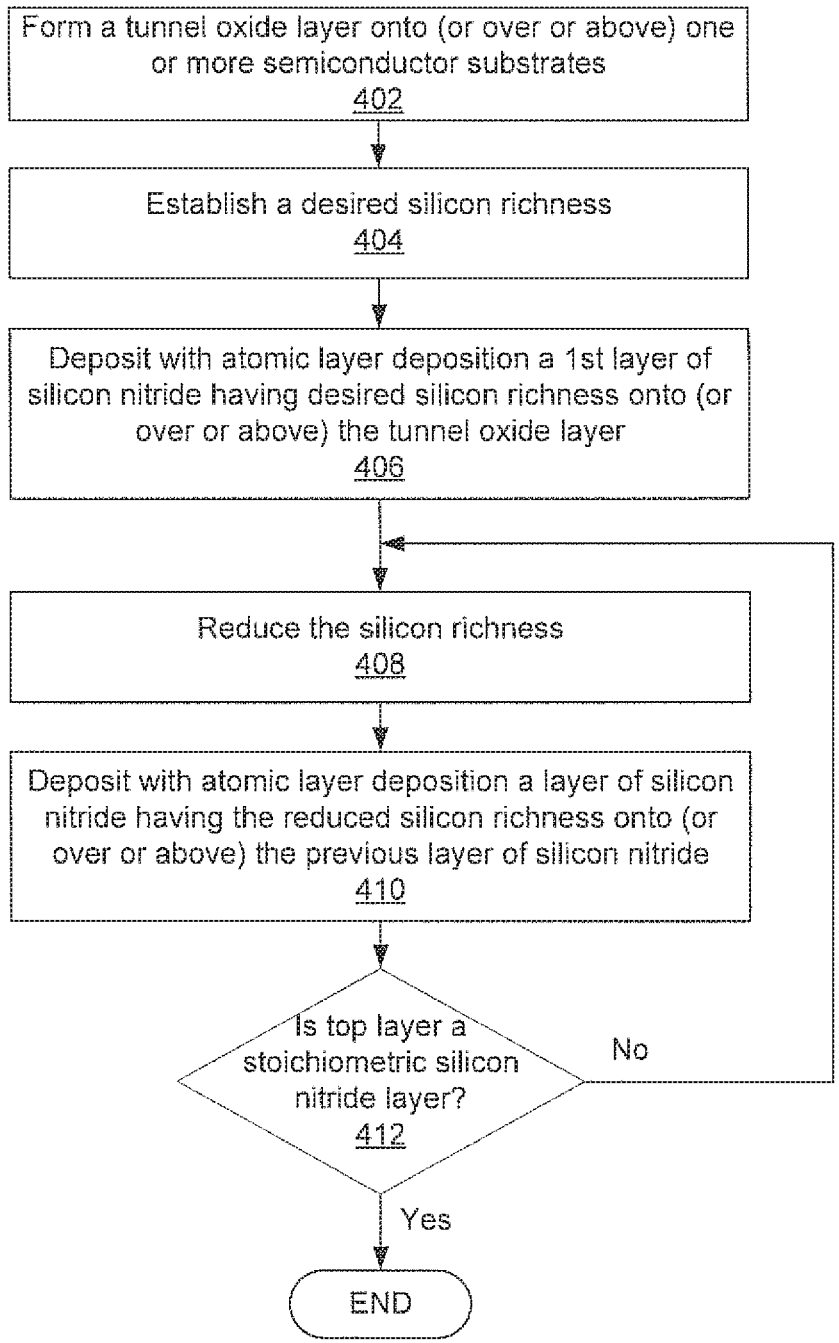
FIG. 4 is a flow diagram of a method in accordance with an embodiment of the invention.

FIG. 4 is a flow diagram of an example method 400 in accordance with various embodiments of the invention for producing integrated circuits (e.g., non-volatile memory devices) that include varied silicon richness silicon nitride layers. Although specific operations are disclosed in flow diagram 400, such operations are examples. Method 400 may not include all of the operations illustrated by FIG. 4. Also, method 400 may include various other operations and/or variations of the operations shown by FIG. 4. Likewise, the sequence of the operations of flow diagram 400 can be modified. It is appreciated that not all of the operations in flow diagram 400 may be performed.

Specifically, method 400 can include forming a tunnel oxide layer onto (or over or above) one or more semiconductor substrates. Additionally, a desired silicon richness value can be predefined or pre-establish for a first silicon nitride layer to be deposited onto (or over or above) the tunnel oxide layer. Utilizing atomic layer deposition, a first layer of silicon nitride having the desired silicon richness value can be deposited onto (or over or above) the tunnel oxide layer. In addition, a reduction can be made to the silicon richness value. Furthermore, utilizing atomic layer deposition, an additional layer of silicon nitride having the reduced silicon richness value can be deposited onto (or over or above) the previous layer of silicon nitride. A determination can be made as to whether the top layer of silicon nitride is a stoichiometric silicon nitride layer. If not, process 400 can return to the operation involving the reduction of the silicon richness value. However, if it is determined that the top layer of silicon nitride is a stoichiometric silicon nitride layer, process 400 can be ended.

Figure 5A:
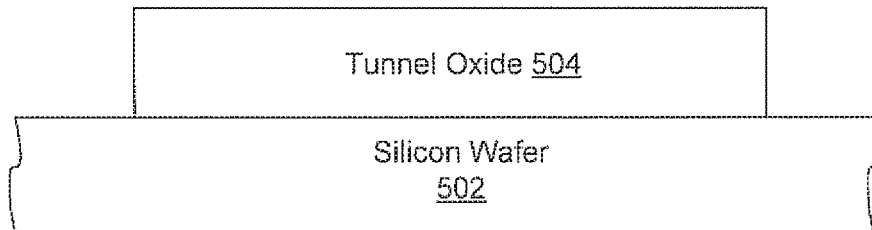
FIGS. 5A-5D show various stages during fabrication of an IC memory device in accordance with various embodiments of the invention.

At operation 402 of FIG. 4, a tunnel oxide layer (e.g., 204) can be formed onto (or over or above) one or more semiconductor substrates (e.g., 102). It is pointed out that operation 402 can be implemented in a wide variety of ways. For example, in one embodiment. FIG. 5A is a side sectional view of a tunnel oxide layer 504 formed onto (or over or above) a silicon wafer 502 at operation 402. In an embodiment, the forming of the tunnel oxide layer 504 onto (or over or above) the silicon wafer 502 at operation 402 can be performed using atomic layer deposition, but is not limited to such. Furthermore, it is noted that the tunnel oxide layer 504 can be formed or deposited at any thickness at operation 402. Note that operation 402 can be implemented in any manner similar to that described herein, but is not limited to such.

At operation 404, a desired silicon richness value can be predefined or pre-establish for a first silicon nitride layer to be deposited onto (or over or above) the tunnel oxide layer. It is noted that the operation 404 can be implemented in a wide variety of ways. For example, in one embodiment, at operation 404 a desired silicon richness value can be predefined at a silicon richness ranging from one extreme of almost 100% silicon with the remaining percentage being nitride to the other extreme of almost 100% nitride with the remaining percentage being silicon, and anywhere in between. In addition, in an embodiment, at operation 404 a desired silicon richness value can be predefined at a silicon richness of k~1.6 (wherein k is the extinction coefficient at a wavelength of 248 nm), but is not limited to such. However, the desired silicon richness value can be predefined at any type of silicon richness at operation 404. It is noted that operation 404 can be implemented in any manner similar to that described herein, but is not limited to such.

Figure 5B:
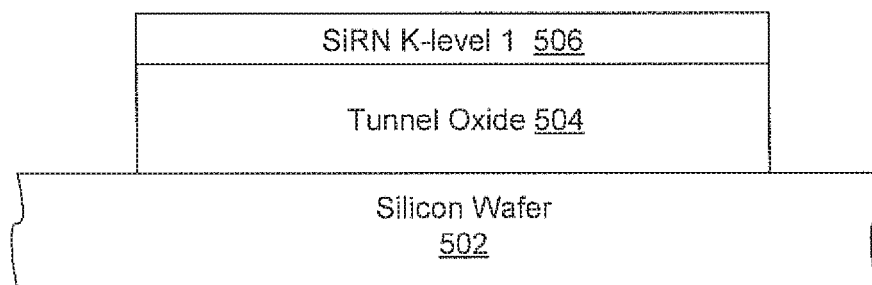

At operation 406 of FIG. 4, utilizing atomic layer deposition, a first layer of silicon nitride (e.g., 206') having the desired silicon richness value can be deposited onto (or over or above) the tunnel oxide layer. Note that the operation 406 can be implemented in a wide variety of ways. For example, in an embodiment. FIG. 5B is a side sectional view of a first layer of silicon nitride 506 having the desired silicon richness value deposited via atomic layer deposition onto (or over or above) the tunnel oxide layer 504 at operation 406. Furthermore, it is noted that the silicon nitride layer or film 506 can be deposited at any thickness at operation 406. For example, in one embodiment, the silicon nitride layer 506 can be deposited at operation 406 to have a thickness of approximately 2-10 angstroms (or approximately 0.2-1 nm), but is not limited to such. It is noted that operation 406 can be implemented in any manner similar to that described herein, but is not limited to such.

At operation 408, a reduction can be made to the silicon richness value. It is pointed out that the operation 408 can be implemented in a wide variety of ways. For example, in one embodiment, the silicon richness value can be reduced by a predefined amount, but is not limited to such. Additionally, in one embodiment, the silicon richness value can be reduced at operation 408 to have a silicon richness of k~1.4, but is not limited to such. However, the silicon richness value can be reduced at operation 408 to have any type of silicon richness. Note that operation 408 can be implemented in any manner similar to that described herein, but is not limited to such.

Figure 5C:
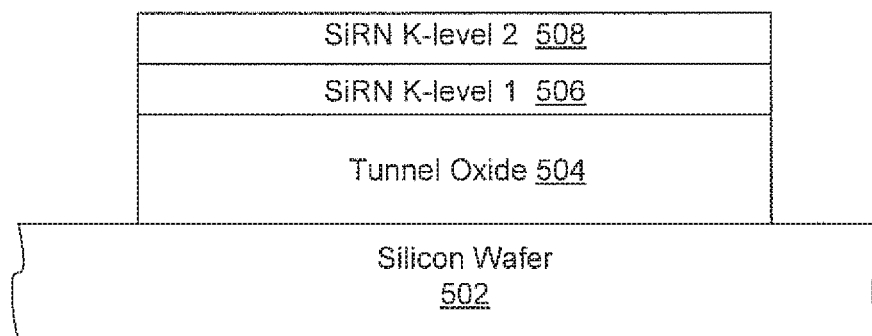

At operation 410 of FIG. 4, utilizing atomic layer deposition, an additional layer of silicon nitride having the reduced silicon richness value can be deposited onto (or over or above) the previous layer of silicon nitride. It is noted that the operation 410 can be implemented in a wide variety of ways. For example, in one embodiment, FIG. 5C is a side sectional view of an additional layer of silicon nitride 508 having the reduced silicon richness value deposited at operation 410 via atomic layer deposition onto (or over or above) the previous silicon nitride layer 506. It is noted that the silicon nitride film 508 can be deposited at operation 410 to any thickness at operation 410. For example, in one embodiment, the silicon nitride film 508 can be deposited at operation 410 to have a thickness of approximately 2-10 angstroms (or approximately 0.2-1 nm), but is not limited to such. It is pointed out that operation 410 can be implemented in any manner similar to that described herein, but is not limited to such.

Figure 5D:
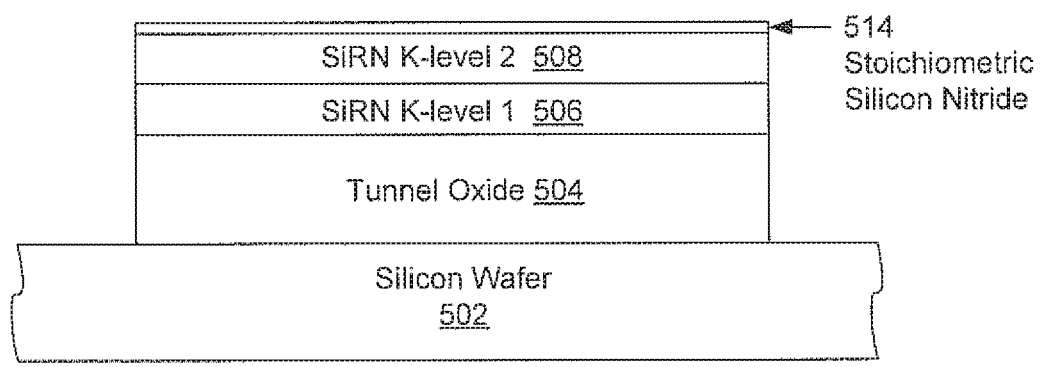

At operation 412, a determination can be made as to whether the top layer of silicon nitride is a stoichiometric silicon nitride layer (e.g., as shown by stoichiometric silicon nitride layer 514 of FIG. 5D). If not, process 400 can proceed to the beginning of operation 408. However, if it is determined at operation 412 that the top layer of silicon nitride is a stoichiometric silicon nitride layer (e.g., 514 of FIG. 5D), process 400 can be ended. Note that the operation 412 can be implemented in a wide variety of ways. For example, operation 412 can be implemented in any manner similar to that described herein, but is not limited to such.

In accordance with the above description, method 400 can produce integrated circuits (e.g., non-volatile memory devices) that include varied silicon richness silicon nitride layers. It is noted that method 400 may produce one or more potential benefits similar to those described herein, but is not limited to such. In addition, method 400 is not limited in any way by those potential benefits.

Figure 6:
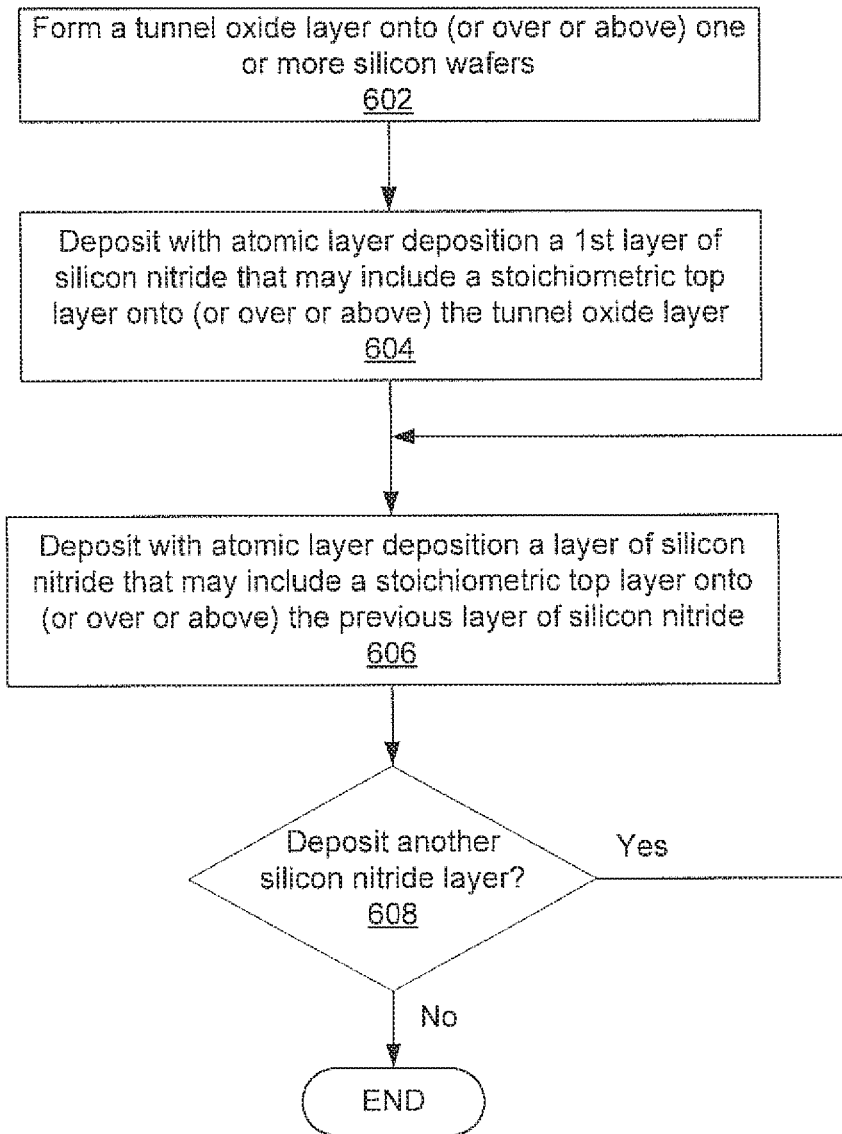
FIG. 6 is a flow diagram of another method in accordance with one embodiment of the invention.

FIG. 6 is a flow diagram of an example method 600 in accordance with various embodiments of the invention for producing integrated circuits (e.g., non-volatile memory devices) that include varied silicon richness silicon nitride layers. Although specific operations are disclosed in flow diagram 600, such operations are examples. Method 600 may not include all of the operations illustrated by FIG. 6. Also, method 600 may include various other operations and/or variations of the operations shown by FIG. 6. Likewise, the sequence of the operations of flow diagram 600 can be modified. It is appreciated that not all of the operations in flow diagram 600 may be performed.

Specifically, method 600 can include forming a tunnel oxide layer onto (or over or above) one or more semiconductor substrates. Additionally, using atomic layer deposition, a first layer of silicon nitride having a first silicon richness value can be deposited onto (or over or above) the tunnel oxide layer. Furthermore, utilizing atomic layer deposition, an additional layer of silicon nitride having a different silicon richness value than the previous silicon nitride layer can be deposited onto (or over or above) the previous layer of silicon nitride. A determination can be made as to whether to deposit another silicon nitride layer. If so, process 600 can return to the operation involving the deposition of an additional silicon nitride layer. However, if it is determined that no more silicon nitride layers are to be deposited, process 600 can be ended.

Figure 7A:
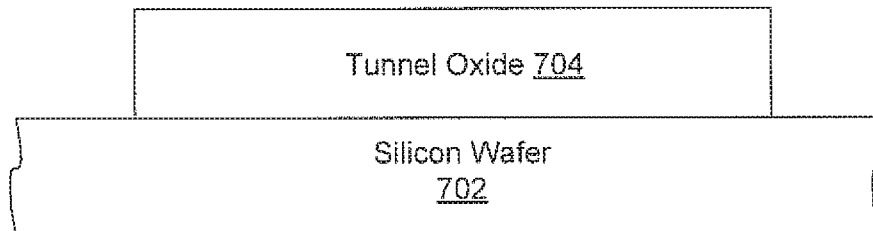
FIGS. 7A-7C show various stages during fabrication of an IC memory device in accordance with various embodiments of the invention.

At operation 602 of FIG. 6, a tunnel oxide layer (e.g., 204) can be formed onto (or over or above) one or more semiconductor substrates (e.g., 102). It is pointed out that the operation 602 can be implemented in a wide variety of ways. For example, in an embodiment, FIG. 7A is a side sectional view of a tunnel oxide layer 704 formed onto (or over or above) a semiconductor wafer 702 at operation 602. In one embodiment, the forming of the tunnel oxide layer 704 onto (or over or above) the semiconductor wafer 702 at operation 602 can be performed using atomic layer deposition, but is not limited to such. Furthermore, it is noted that the tunnel oxide layer 704 can be formed or deposited at operation 602 to any thickness. It is noted that operation 602 can be implemented in any manner similar to that described herein, but is not limited to such.

Figure 7B:
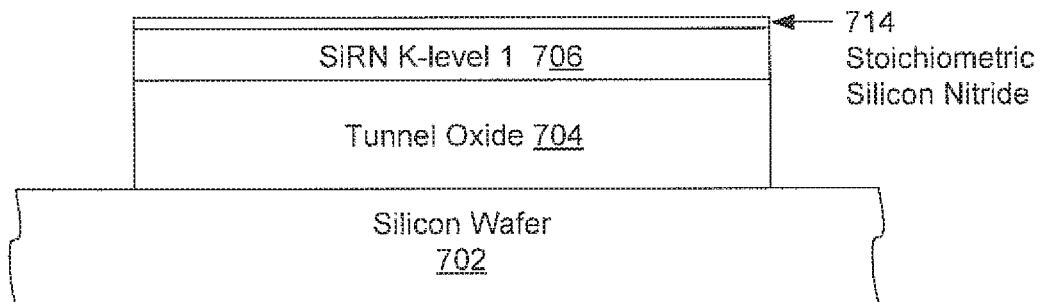

At operation 604, using atomic layer deposition, a first layer of silicon nitride (e.g., 206) having a first silicon richness can be deposited onto (or over or above) the tunnel oxide layer. It is noted that the operation 604 can be implemented in a wide variety of ways. For example, in one embodiment. FIG. 7B is a side sectional view of a first layer of silicon nitride 706 having a first silicon richness deposited at operation 604 via atomic layer deposition onto (or over or above) the tunnel oxide layer 704. In an embodiment, the silicon nitride film or layer 706 can have a silicon richness of k~1.6 (wherein k is the extinction coefficient at a wavelength of 248 nm) at operation 604, but is not limited to such. However, the silicon nitride film 706 can be deposited at operation 604 via atomic layer deposition with any type of silicon richness. For example, in one embodiment, the silicon nitride film 706 can be deposited at operation 604 via atomic layer deposition with a silicon richness ranging from one extreme of almost 100% silicon with the remaining percentage being nitride to the other extreme of almost 100% nitride with the remaining percentage being silicon, and anywhere in between. Note that in an embodiment, the first layer of silicon nitride 706 can be deposited at operation 604 to include an upper film or layer of stoichiometric silicon nitride 714, but is not limited to such. Furthermore, it is noted that the silicon nitride film 706 can be deposited at operation 604 to any thickness. For example, in one embodiment, the silicon nitride film 706 can be deposited at operation 604 to have a thickness of approximately 2-10 angstroms (or approximately 0.2-1 nm), but is not limited to such. It is noted that operation 604 can be implemented in any manner similar to that described herein, but is not limited to such.

Figure 7C:
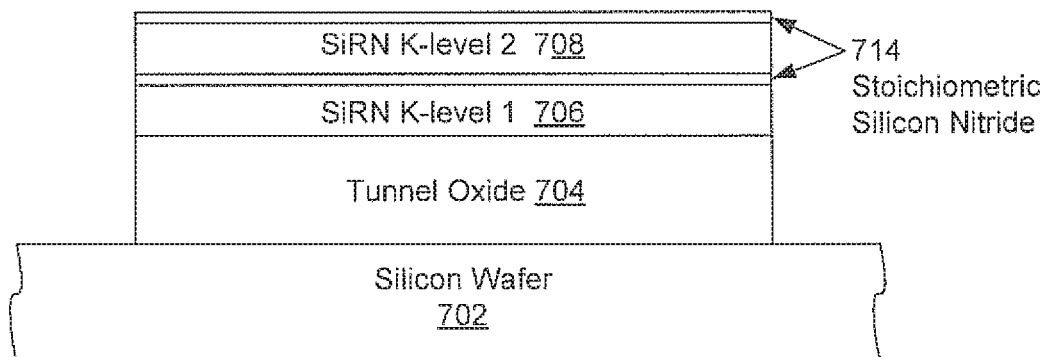

At operation 606 of FIG. 6, utilizing atomic layer deposition, an additional layer of silicon nitride having a different silicon richness value than the previous silicon nitride layer can be deposited onto (or over or above) the previous layer of silicon nitride. Note that the operation 606 can be implemented in a wide variety of ways. For example, in one embodiment, FIG. 7C is a side sectional view of an additional layer of silicon nitride 708 having a different silicon richness value than the previous silicon nitride layer deposited at operation 606 via atomic layer deposition onto (or over or above) the previous silicon nitride layer 706. In one embodiment, the silicon nitride film or layer 708 can have a silicon richness of k~1.4 or ~1.7 at operation 606, but is not limited to such. Note that in an embodiment, the silicon nitride film 708 can be deposited at operation 606 via atomic layer deposition with a silicon richness value that is greater than or less than the silicon richness value of the previously deposited silicon nitride layer 706. In one embodiment, the additional layer of silicon nitride 708 can be deposited at operation 606 to include an upper film or layer of stoichiometric silicon nitride 714, but is not limited to such. In addition, it is noted that the silicon nitride film 708 can be deposited at operation 606 to any thickness. For example, in one embodiment, the silicon nitride film 708 can be deposited at operation 606 to have a thickness of approximately 2-10 angstroms (or approximately 0.2-1 nm), but is not limited to such. It is pointed out that operation 606 can be implemented in any manner similar to that described herein, but is not limited to such.

At operation 608, a determination can be made as to whether to deposit another silicon nitride layer onto (or over or above) the previous layer of silicon nitride. If so, process 600 can proceed to the beginning of operation 606. However, if it is determined at operation 608 that no more silicon nitride layers are to be deposited, process 600 can be ended. Note that the operation 608 can be implemented in a wide variety of ways. For example, operation 608 can be implemented in any manner similar to that described herein, but is not limited to such.

In accordance with the above description, method 600 may produce integrated circuits (e.g., non-volatile memory devices) that include varied silicon richness silicon nitride layers. Note that method 600 may produce one or more potential benefits similar to those described herein, but is not limited to such. Furthermore, method 600 is not limited in any way by those potential benefits.

Figure 8:
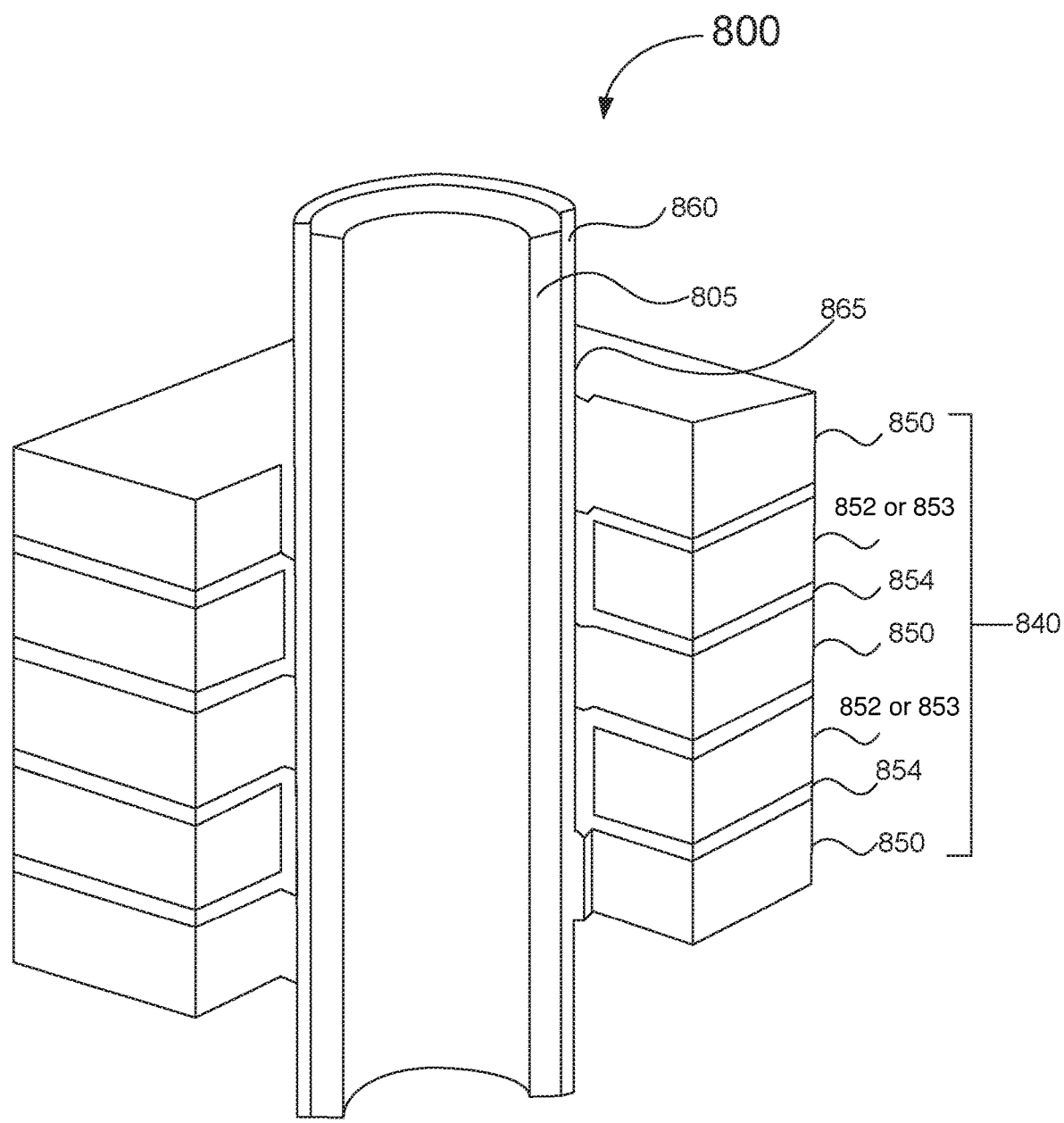
FIG. 8 is an isometric sectional view of a three-dimensional (3D) memory device in accordance with an embodiment of the invention.

FIG. 8 is an isometric sectional view of a 3D memory device. In one embodiment, 3D memory device may be 3D NAND 800, formed within a device opening in stack 840. In one embodiment, stack 840 is formed by depositing alternating layers of gate layers 852 and inter-cell dielectric layers 850 overlying substrate 802 (not shown in FIG. 8). In one embodiment, device opening is disposed substantially perpendicular to the top surface of substrate 802. The profile of inner surface or wall 865 of device opening may be relatively straight, as illustrated in FIG. 8. Alternatively, the profile of inner surface 865 may not be straight and go in and out in different layers of stack 840.

In one embodiment, inter-cell dielectric layers 850 may be formed by any suitable deposition methods known in the art, such as sputtering, chemical vapor deposition (CVD), molecular beam epitaxy (MBE), atomic layer deposition (ALD), etc. The inter-cell dielectric layers 850 may include silicon dioxide ($SiO_2$) or other dielectric material having a thickness from about 20 nanometers (nm) to about 50 nm or other appropriate thicknesses. In some embodiments, inter-cell dielectric layers 850 may have variable thicknesses throughout stack 840. In one alternative embodiment, some or all of the inter-cell dielectric layers 850 may be grown by a thermal oxidation process, in-situ steam generation process or plasma or radical oxidation technique.

Figure 9:
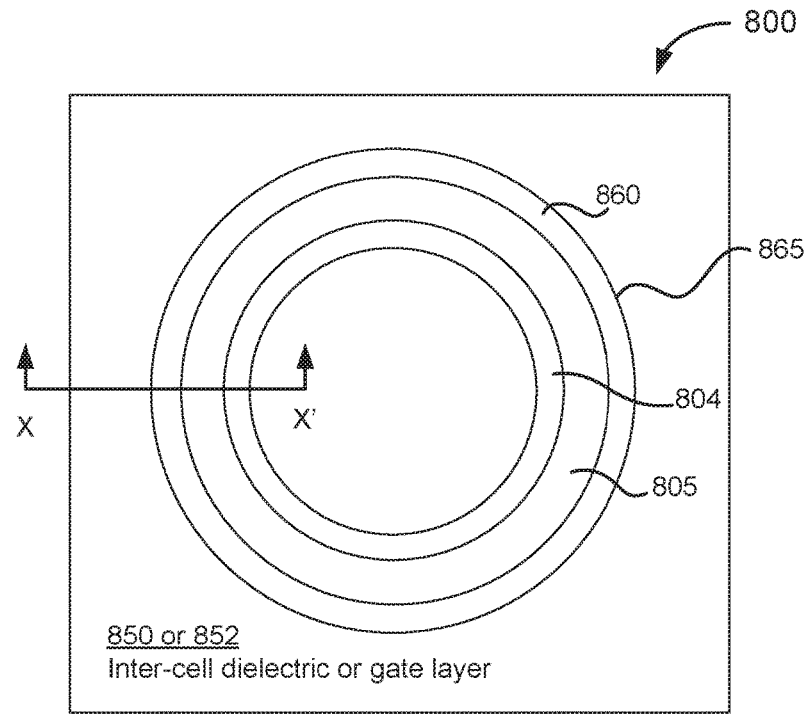
FIG. 9 is a top sectional view of a three-dimensional (3D) memory device in accordance with an embodiment of the invention.

Generally, gate layers 852 may eventually become or electrically coupled to control gates of NV transistors in 3D NAND 800. In one embodiment, gate layers 852 may be coupled to word-lines. As best shown in FIG. 9, gate layers 852 may be formed over a top surface of each inter-cell dielectric layer 850. In one embodiment, when polysilicon control gates are desired, gate layers 850 may be formed by a deposition process, and include a single doped polysilicon layer, either positively or negatively doped (p+ doped or n+ doped) with appropriate dopants and concentration known in the art. The gate layers 852 may have a thickness of from about 30 nm to about 60 nm or other thicknesses. In some embodiments, gate layers 852 may have variable thicknesses throughout stack 840. In one alternative embodiment, when metal control gates are desired, the gate layers 852 of FIG. 8 may be formed by a two-step process, first by a deposition process and composed of a single layer of sacrificial silicon nitride 853 having a thickness of from about 30 nm to about 60 nm or other thicknesses. Sacrificial nitride layers 853, may then be replaced by or converted to metal gate layers 852 in a subsequent step. In some embodiments, metal gate layers 852 may be wrapped around by gate coating layer 854. Gate coating layer 854 may include titanium nitride.

In one embodiment, after device opening is formed within stack 840, blocking dielectric layer 860 may be formed on the inner surface 865 of device opening. In one embodiment, blocking dielectric layer 860 may include a single layer or multiple layers, and may include layer(s) of $SiO_2$ or other dielectric materials coating the inner wall 865 of device opening. The blocking dielectric layer 860 may be formed by suitable conformal deposition process, such as CVD and ALD, and have a relatively uniform thickness of about 30Å to about 70Å or other thicknesses. As shown in FIG. 8, silicon nitride (SN) layer 805 may be formed overlying or directly on the inside surface of blocking dielectric layer 860.

FIG. 9 is a top sectional view of 3D NAND 800, such as the embodiment illustrated in FIG. 8. In one embodiment, 3D NAND 800 may have a cross-sectional shape of a circle. It will be the understanding that the circular shape is solely for illustrative purposes, and should not be considered as a limitation. In other embodiments, device openings of 3D NAND 80 may have other cross-sectional shapes, such as oval, diamond, etc. As best shown in FIG. 9, blocking dielectric layer 860 may be formed overlying the inner surface 865 of device opening. Subsequently, SN layer 805 may be formed abutting blocking dielectric layer 860. In one embodiment, tunnel oxide 804 may be formed abutting SN layer 805. As will be explained in later sections. SN layer 805 may be a multi-layer structure, adopting features and fabrication process of varied or variable silicon richness silicon nitride layers (e.g., 206, 206', 208, 208', 210, 210', 212, etc.) as best illustrated in FIGS. 2A, 2B, 5 series, and 7 series, and explained in their respective description.

Figure 10A:
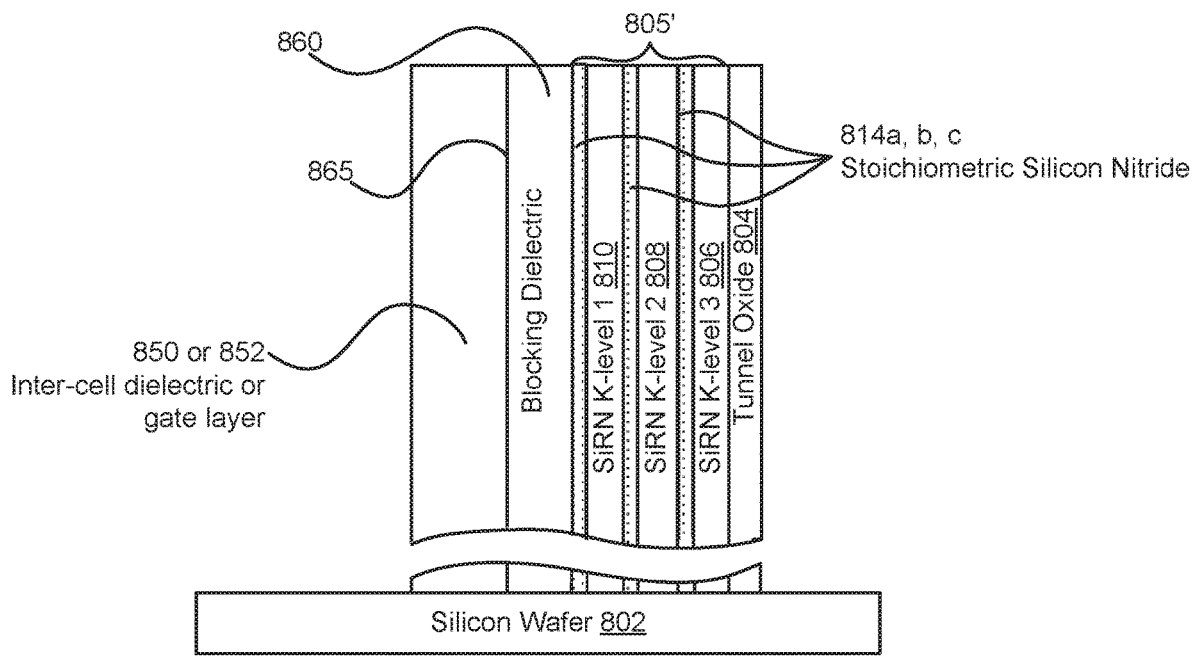
FIGS. 10A, 10B, and 10C are cross-sectional views along X-X' of three alternative embodiments of a three-dimensional (3D) memory device illustrated in FIG. 9.

FIG. 10A is a cross-sectional view along X-X' of FIG. 9, showing multi-layer SN layer 805' according to one embodiment of the subject matter. In one embodiment, blocking dielectric is disposed abutting or in contact with inner surface 865 of device opening. Stoichiometric SN layer 814a may then be formed abutting blocking dielectric layer 860. Subsequently, non-stoichiometric SN layer 810 including silicon richness value of K-level 1 is disposed abutting stoichiometric SN layer 814a. In one embodiment, stoichiometric SN may refer to silicon nitride layer including a silicon to nitride atomic ratio of 3 to 4 ($Si_3N_4$). Non-stoichiometric SN may refer to SN layer having a silicon to nitride atomic ratio deviated from 3 to 4. Subsequently, another stoichiometric SN layer 814b may be disposed abutting non-stoichiometric SN layer 810. In alternative embodiments, the two stoichiometric SN layers 814a and 814b may have the same or different thicknesses. Subsequently, non-stoichiometric SN layer 808 including silicon richness of K-level 2 is disposed abutting stoichiometric SN layer 814b. In one embodiment, the three stoichiometric SN layers 814a-c and three non-stoichiometric SN layers 806, 808, 810 integrally form multi-layer SN layer 805' of 3D NAND 800. It will be the understanding that multi-layer SN layer 805' illustrated in FIG. 10A is for illustrative purposes, not for limitation. In other embodiments, SN layer 805' may have more than or fewer than 3 layers of non-stoichiometric SN layer(s), as long as two adjacent/neighboring non-stoichiometric layers, such as 806 and 808, are separated by one stoichiometric SN layer, such as 814c. Subsequent to the formation of multi-layer SN layer 805', tunnel oxide 804 is formed abutting or in contact with the last non-stoichiometric SN layer, such as 806 as illustrated in FIG. 10A.

Figure 10B:
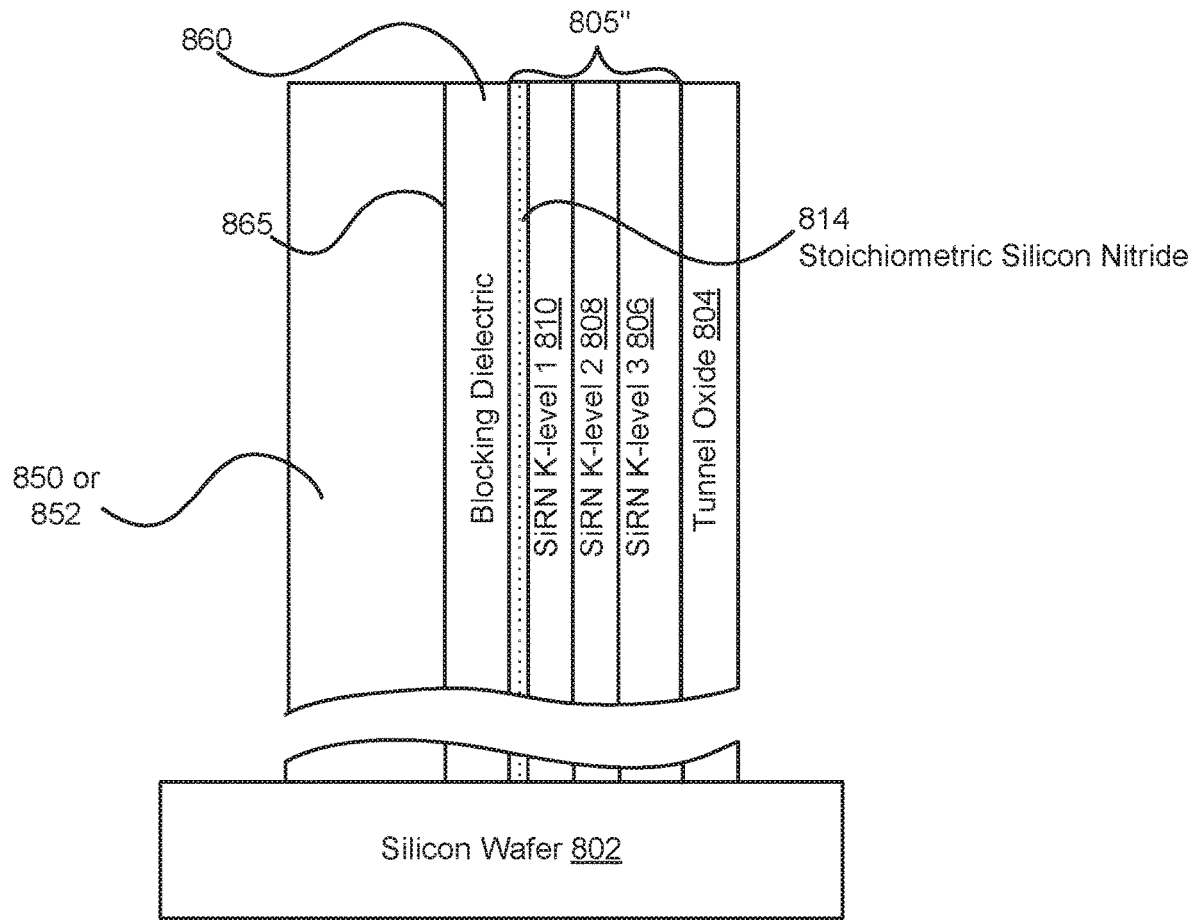

FIG. 10B is a cross-sectional view along X-X' of FIG. 9, showing multi-layer SN layer 805" according to another embodiment of the subject matter. In one embodiment, blocking dielectric may be disposed abutting or in contact with inner surface 865 of device opening. In one embodiment, stoichiometric SN layer 814 may then be formed abutting blocking dielectric layer 860. Subsequently, non-stoichiometric SN layers 810, 808 and 806 including silicon richness of K-level 1, 2 and 3, respectively may be disposed sequentially abutting or in contact with stoichiometric SN layer 814. As best illustrated in FIG. 10B, stoichiometric SN layer 814, and non-stoichiometric SN layers 810, 808, 806 formed integrally multi-layer SN layer 805" of 3D NAND 800. It will be the understanding that multi-layer SN layer 805" illustrated in FIG. 10B is for illustrative purposes, not for limitation. In alternative embodiments, SN layer 805" may have more or fewer than 3 layers of non-stoichiometric SN layer(s), as long as two adjacent/neighboring non-stoichiometric layers, such as 806 and 808, are abutting or in contact with one another. Subsequent to the formation of multi-layer SN layer 805", tunnel oxide 804 is formed abutting or in contact with the last non-stoichiometric SN layer, such as 806, as illustrated in FIG. 10B.

Figure 11:
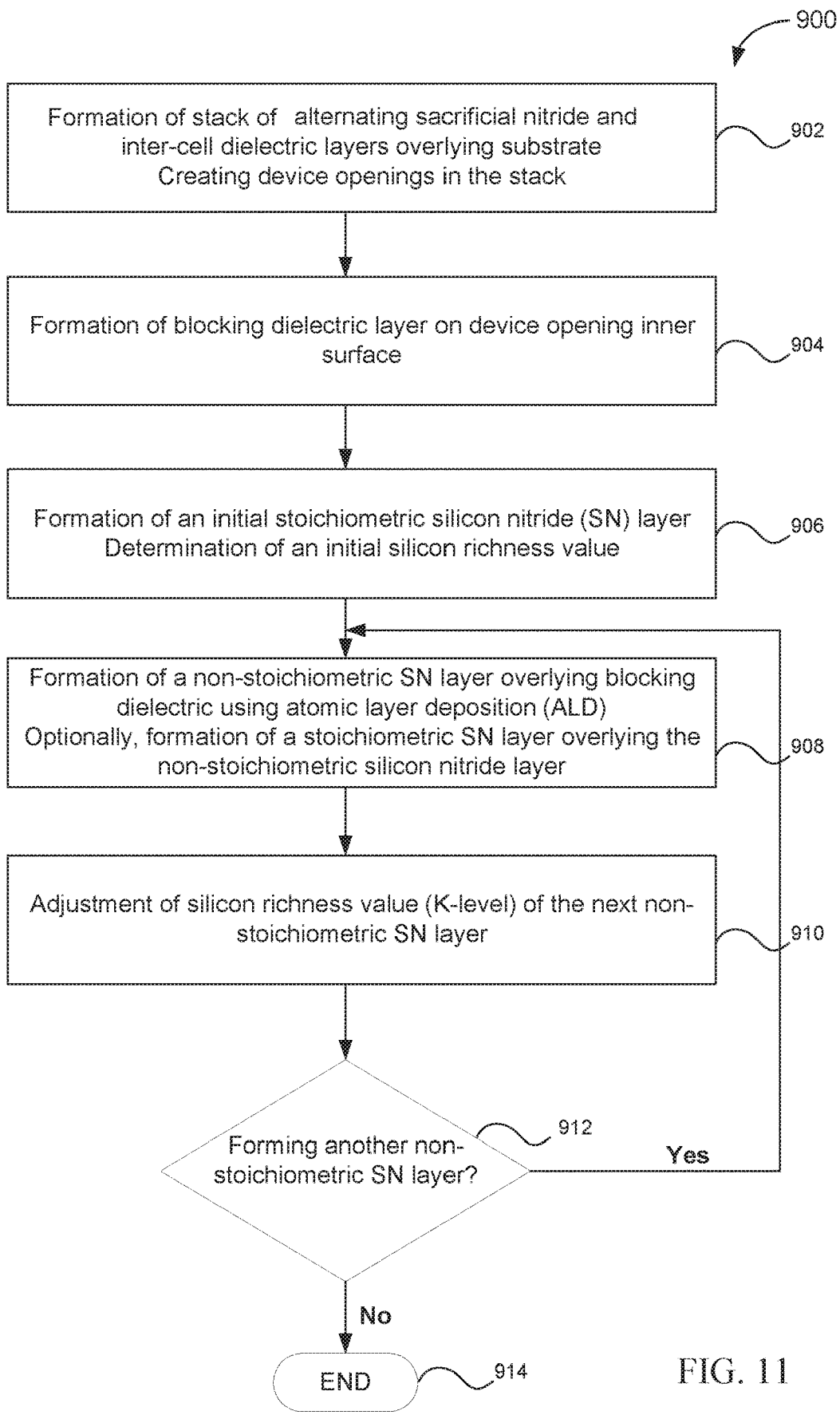
FIG. 11 is a flow diagram of another method in accordance with one embodiment of the invention.

FIG. 11 is a flow diagram of an example method 900 in accordance with various embodiments of the invention for fabricating non-volatile memory devices, such as 3D NAND 800, that include varied silicon richness SN layers, such as non-stoichiometric SN layers 806, 808, 810. Although specific operations are disclosed in flow diagram 900, such operations are examples. Method 900 may not include all of the operations illustrated by FIG. 11. Also, method 900 may include various other operations and/or variations of the operations shown by FIG. 11. Likewise, the sequence of the operations of flow diagram 900 may be modified. It is appreciated that not all of the operations in flow diagram 900 may be performed.

Specifically, method 900 may include forming a blocking dielectric layer onto (or overlying or abutting) an inside surface of a device opening of 3D NAND. Additionally, using atomic layer deposition, a first layer of silicon nitride having a first silicon richness value may be deposited onto (or overlying or abutting) the blocking dielectric layer. Furthermore, utilizing atomic layer deposition, an additional layer of silicon nitride having the same or a different silicon richness value than the previous silicon nitride layer may be deposited onto (or overlying or abutting) the previous layer of silicon nitride. A determination can be made as to whether to deposit another silicon nitride layer. If so, process 900 may return to the operation involving the deposition of an additional silicon nitride layer. However, if it is determined that no more silicon nitride layers are to be deposited, process 900 may be terminated.

At operation 902 of FIG. 11, a device stack that may include an alternating arrangement of conductive gate layers and dielectric layers of a non-planar memory device may be formed overlying a substrate. Alternatively, as previously described, sacrificial nitride layers may be formed instead of the gate layers. Sacrificial nitride layers may be replaced by metal or non-metal gate layers in later process steps. Subsequent to that, multiple vertical device openings may be created in the device stack, which are substantially perpendicular to the top surface of the substrate. One example of such embodiment is illustrated in FIG. 8, in which 3D NAND 800 is featured. In some embodiments wherein metal gate layers are desired, sacrificial nitride layer (not shown) may be formed in the device stack. The sacrificial nitride layers may be replaced with metal gate layers in later process steps.

At operation 904, a blocking dielectric layer, such as blocking dielectric layer 860 in FIG. 8 is formed onto (or overlying or abutting) inner surface 865 of device opening. In various embodiments, blocking dielectric layer 860 may be formed using processes, such as CVD, PVD, ALD.

At operation 906, using atomic layer deposition, a first layer of stoichiometric SN layer (e.g., 814 or 814a) may be deposited onto (or overlying or abutting) blocking dielectric layer 860. In one embodiment, an initial silicon richness value of the first silicon richness (K-level) may be pre-determined, based on system requirements. In one embodiment, the initial silicon richness value can be predefined at a silicon richness ranging from one extreme of almost 100% silicon with the remaining percentage being nitride to the other extreme of almost 100% nitride with the remaining percentage being silicon, and anywhere in between.

At operation 908, a non-stoichiometric SN layer 810 of a first silicon richness K-level 1 may be deposited onto (or overlying or abutting) stoichiometric SN layer 814 or 814a. It is noted that operation 908 may be implemented in a wide variety of ways. For example, in one embodiment, non-stoichiometric SN layer having the initial silicon richness that is pre-determined in operation 906 may be deposited using ALD in an ALD chamber 104, as described in FIG. 1. Furthermore, it is noted that non-stoichiometric SN layer 810 may be deposited at any thickness. For example, in one embodiment, non-stoichiometric SN layer 810 may be deposited at operation 908 to have a thickness of approximately 2-10 angstroms (or approximately 0.2-1 nm), but is not limited to such. It is noted that operation 908 can be implemented in any manner similar to that described herein, but is not limited to such.

At operation 910, adjustment may be made to the silicon richness value of the next non-stoichiometric SN layer, such as 808. In various embodiments, according to system requirements, silicon richness value (K-level 2) of the next non-stoichiometric SN layer 808 may be the same, greater, or less than the initial silicon richness value (K-level 1).

At operation 912, a decision is made whether an additional layer of non-stoichiometric SN layer is desired. If the decision is "No", the SN layer deposition process will be terminated. If the decision is "Yes", the process flow may go back to operation 908. At operation 908, utilizing atomic layer deposition, an additional layer of non-stoichiometric SN layer, such as 808, may be deposited onto (or overlying or abutting) non-stoichiometric SN layer of K-level 1810. In one embodiment, SN layer of K-level 2 808 may have the silicon richness level determined in operation 912, which may be the same or a different silicon richness value than the previous silicon nitride layer. For example, in one embodiment, SN layer of K-level 2 808 may be deposited at operation 908 to have a thickness of approximately 2-10 angstroms (or approximately 0.2-1 nm), but is not limited to such. It is pointed out that operation 908 can be implemented in any manner similar to that described herein, but is not limited to such. Referring to FIG. 10A and operation 908 of FIG. 11, optionally, a layer of stoichiometric SN layer 814*b* may be deposit prior to the deposition of non-stoichiometric SN layer of K-level 2 808. The stoichiometric SN layer 814*b* may separate the two non-stoichiometric SN layers of K-level 1 810 and K-level 2 808. In an alternative embodiment, referring to FIG. 10B and operation 908 of FIG. 11, no stoichiometric SN layer may be deposited prior to the deposition of non-stoichiometric SN layer of K-level 2 808. In one embodiment, SN layers of K-level 1810 and K-level 2 808 may be in contact with one another.

After non-stoichiometric SN layer of K-level 2 808 is deposited, the process flow may again advance to operation 912 to determine whether an additional SN layer is required. Both FIGS. 10A and 10B illustrated a total of 3 non-stoichiometric SN layers 810, 808, 806. However, it will be the understanding that this is one of the embodiments for illustrative purposes, and should not be considered as a limitation.

Figure 10C:
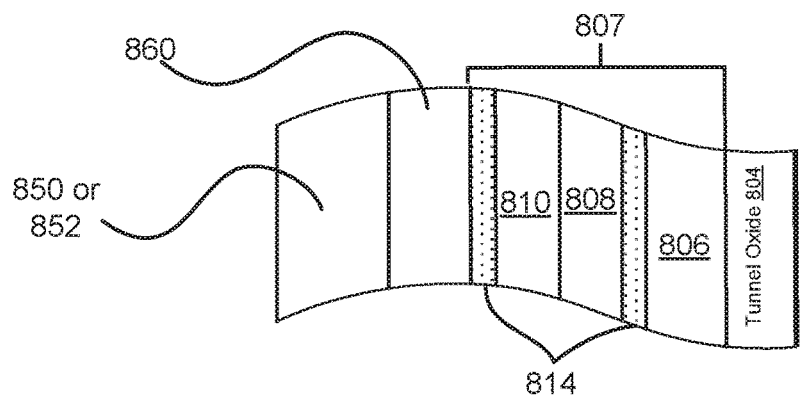

At operation 912, a "No" decision may terminate the SN layer deposition process. In one embodiment, as illustrated in FIG. 10A, the finished SN layer 805' may have multiple non-stoichiometric SN layers 810, 808, 806. etc. having the same or different silicon richness value (K-level) separated by at least one layer of stoichiometric SN layer 814*a*, *b*, etc. In another embodiment, as illustrated in FIG. 10B, the finished SN layer 805" may have multiple non-stoichiometric SN layers 810, 808.806, etc. having the same or different silicon richness value (K-level) disposed in contact with its neighboring non-stoichiometric SN layers. In another alternative embodiment, as illustrated in FIG. 10C, in the finished SN layer 807, some of the non-stoichiometric SN layers are separated by stoichiometric SN layer 814 as in FIG. 10A, such as 808 and 806. Some non-stoichiometric SN layers, such as 810 and 808 are deposited onto and in contact with one another, as in FIG. 10B. In some embodiments, silicon richness value of non-stoichiometric SN layers may increase unidirectionally from the first layer (abutting blocking dielectric layer) to the $N^{th}$ layer (abutting tunnel oxide layer). In other embodiments, silicon richness value of non-stoichiometric SN layers may decrease unidirectionally from the first layer (abutting blocking dielectric layer) to the $N^{th}$ layer (abutting tunnel oxide layer). In one embodiment, the finished SN layer, such as 805'. 805" and 807 may be a continuous layer spanning across multiple memory cells within a single device opening.

After the SN layer deposition process is terminated, tunnel oxide layer 804 may be formed onto (or abutting or in contact with) the last non-stoichiometric SN layer, such as 806. It will be the understanding that tunnel oxide layer 804 may be formed by conventional processes that are known in the art, such as ALD, CVD, PVD, oxidations, etc. and may be formed to a variety of thicknesses according to system requirements.

In some embodiments, method 900 may define an initial K-level of the first non-stoichiometric SN layer. Silicon richness may be adjusted upwardly (increase K-level) for each subsequent non-stoichiometric SN layer. The process may be terminated in operation 912 when a pre-set K-level is achieved. Alternatively, silicon richness level of each subsequent non-stoichiometric SN layer may be adjusted downwardly (reduce K-level), and the process may be terminated when a pre-set K-level is achieved. In another alternative embodiment, thickness and silicon richness value (K-level) of each non-stoichiometric SN layer may be configured independently, and not corresponding to one another's.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method of fabricating a three-dimensional device, comprising:
   forming a stack, including multiple sacrificial nitride and inter-cell dielectric layers arranged in an alternating arrangement, overlaying a substrate;
   etching at least one opening in the stack;
   forming a blocking dielectric layer overlying an inner surface of the at least one opening;
   depositing a first silicon nitride layer having a first silicon richness value abutting the blocking dielectric layer;
   pre-determining an initial silicon richness value;
   depositing a second silicon nitride layer having the initial silicon richness value, abutting the first silicon nitride layer;
   adjusting the initial silicon richness value to a first updated silicon richness value; and
   depositing a third silicon nitride layer having the first updated silicon richness value.

* * * * *